United States Patent [19]

Kamiya

[11] Patent Number: 4,527,136
[45] Date of Patent: Jul. 2, 1985

[54] SIGNAL COUPLING APPARATUS

[75] Inventor: Kimitaka Kamiya, Osaka, Japan

[73] Assignee: 501 DX Antenna Company, Limited, Kobe, Japan

[21] Appl. No.: 577,230

[22] Filed: Feb. 6, 1984

[30] Foreign Application Priority Data

Feb. 15, 1983 [JP] Japan .................... 58-24272

[51] Int. Cl.³ ............................................ H01P 1/15
[52] U.S. Cl. .................................. 333/103; 333/104; 333/116; 455/3
[58] Field of Search ............... 333/101, 103, 104, 109, 333/115, 116, 164, 21 A; 455/3, 133, 140

[56] References Cited

U.S. PATENT DOCUMENTS 3,571,765  3/1971  Friedman .................... 333/103 X
3,581,243  5/1971  Alford .
3,760,283  9/1973  Lockwood .................... 333/109 X
4,139,827  2/1979  Russell .
4,354,167 10/1982  Terreault et al. ............. 333/109 X

FOREIGN PATENT DOCUMENTS 45506  3/1983  Japan .

Primary Examiner—Paul Gensler
Attorney, Agent, or Firm—Eugene E. Geoffrey, Jr.

[57] ABSTRACT

A transmission line device for coupling two radio waves, such as horizontal and vertical polarized waves such as satellite transmissions, which are traveling in a particular direction along a pair of main transmission lines, selectively to a branch line without problem of mismatch, wherein the branch line is composed of a single feeder and selection of the two waves is effected simply by applying a positive or negative voltage to the feeder.

2 Claims, 4 Drawing Figures

SIGNAL COUPLING APPARATUS

This invention relates to a signal coupling apparatus and, especially, to an improved two-channel directional coupler used for coupling two electric waves traveling along a pair of main transmission lines to a specific branch line in selective fashion. This apparatus is useful to couple two-channel satellite broadcast signals transmitted through a pair of main feeder lines selectively to each indoor receiving unit.

It is well known in the art to couple a high frequency signal traveling in a particular direction along a transmission line to a branch line by means of a so-called "directional coupler", such as those disclosed in U.S. Pat. Nos. 3,581,243 and 4,139,827, for example. Recently, a satellite broadcasting system has been developed and a two-channel transmission plan using horizontal and vertical polarizations has been proposed for this purpose. In this system, both waves are received by a single antenna but are processed separately and transmitted respectively through a pair of main transmission lines. It is, of course, possible to couple these two signals traveling in the main lines to a specific indoor receiving unit by inserting a conventional directional coupler as disclosed in the above U.S. patents in each of the main transmission lines. However, this arrangement requires a pair of connection lines, such as coaxial cables, between the couplers and the indoor unit and results in troublesome and costly wiring. Though it may be anticipated that a single connection line together with a conventional change-over switch could be used, such an arrangement would suffer from a problem of mismatch.

Accordingly, an object of this invention is to provide novel and improved signal coupling apparatus which can branch a pair of main transmission lines and selectively couple them to a specific signal processing unit through a single transmission line with no problem of mismatch.

In accordance with this invention, there is provided a signal coupling apparatus comprising first and second directional couplers adapted for insertion in first and second main transmission lines respectively and with each having a branch terminal. The apparatus further comprises an output terminal for the coupled signal, a first diode coupled between the branch terminal of the first coupler and the output terminal, a second diode coupled between the branch terminal of the second coupler and the output terminal, the first and second diodes having first and second polarities, respectively, with respect to the output terminal, a first series connection of third diode and first dummy resistor coupled between the branch terminal of the first coupler and a reference potential point, and a second series connection of fourth diode and second dummy resistor coupled between the branch terminal of the second coupler and the reference potential point, the third and fourth diodes having the second and first polarities, respectively, with respect to the reference potential point.

These and other objects and features of this invention will be described in more detail hereinunder with reference to the accompanying drawings.

IN THE DRAWINGS

Throughout the drawings, like reference numerals are used to denote corresponding structural components.

Figure 1:
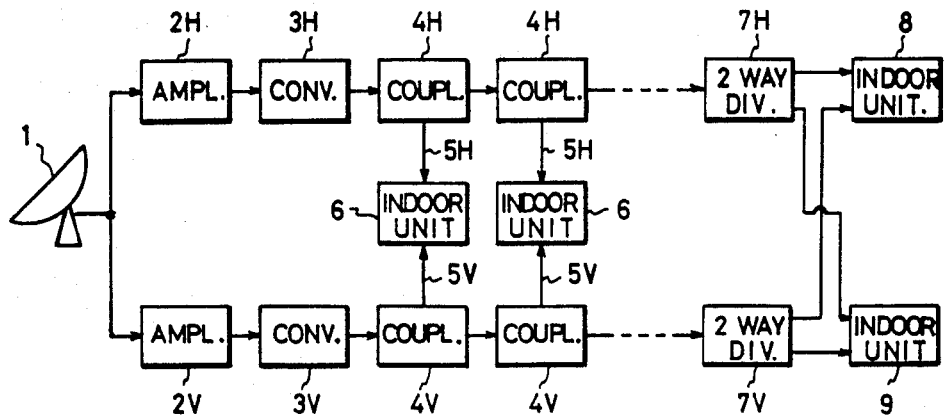
FIG. 1 is a block diagram representing a prior art satellite broadcast receiving system utilizing conventional directional couplers.

Generally, in satellite television broadcasting, transmission is effected using two signals which are equal in frequency but different in polarization, such as horizontal and vertical polarizations. Therefore, a system, as shown in FIG. 1, has been proposed for distributing both satellite broadcast signals to a plurality of television receivers. In the drawing, the horizontal polarization signal received by a parabolic antenna 1 is amplified by a low noise amplifier 2H, converted into a low frequency signal by a down-convertor 3H and transmitted through a plurality of directional couplers 4H. The vertical polarization signal received also by the parabolic antenna 1 is separately amplified by a low noise amplifier 2V, converted into a low frequency signal by a down-converter 3V and transmitted through a plurality of directional couplers 4V, in similar fashion. The directional couplers 4H and 4V are arranged to couple the horizontal and vertical polarized signals in both transmission lines to respective indoor receiving units 6, such as television receivers, through respective pairs of cables 5H and 5V, respectively. At the ends of both transmission lines, two-way power dividers 7H and 7V are provided for distributing the respective polarization signals to indoor units 8 and 9. As clearly shown in the drawing, this system needs a pair of connection cables, such as coaxial cables, 5H and 5V for each indoor unit 6.

As suggested in the preface, both signals can be selectively coupled to each indoor unit 6 through a single cable by inserting a change-over switch (not shown) between both couplers 4H and 4V and the single cable. However, in such an arrangement, either branch terminal of the directional coupler disconnected from the cable is floating and causes a problem of mismatch.

Figure 2:
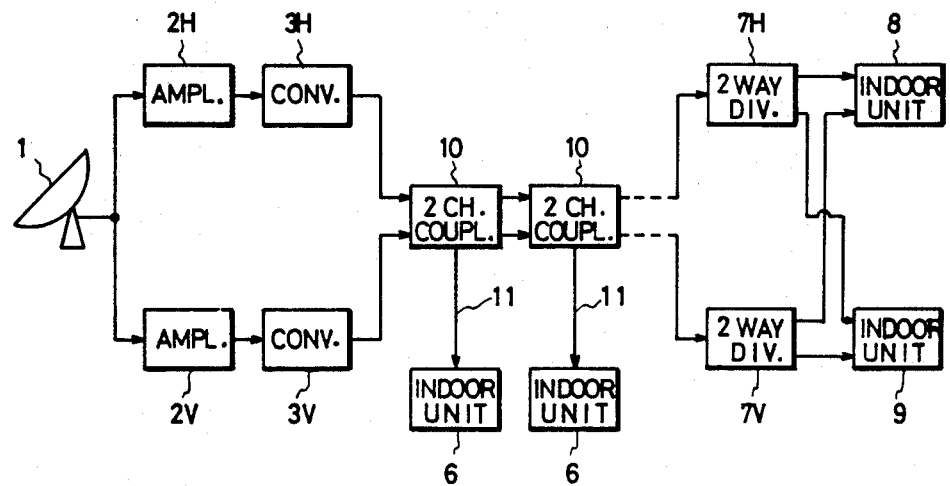
FIG. 2 is a block diagram representing a novel satellite broadcast receiving system utilizing the signal coupling apparatus according to this invention.

In contrast, according to this invention, as shown in FIG. 2, a plurality of two-channel signal coupling units 10 are cascaded in common to both signal transmission lines, instead of the directional couplers 4H and 4V in FIG. 1, and each indoor unit 6 is connected to each coupling unit 10 through a single cable line 11. The remaining configuration of FIG. 2 is exactly the same as that of FIG. 1. A circuit arrangement of an embodiment of each coupling unit or apparatus 10 is shown in FIG. 3.

Figure 3:
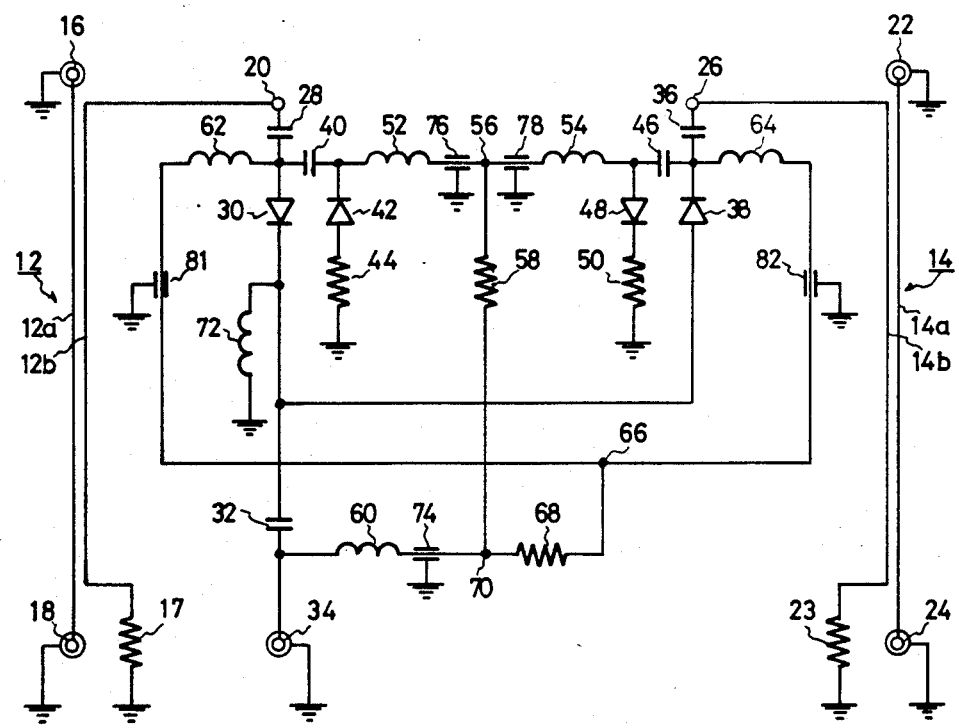
FIG. 3 is a schematic circuit diagram representing an embodiment of the signal coupling apparatus according to this invention.

As shown in FIG. 3, the inventive apparatus includes a pair of directional couplers 12 and 14, which may be of a conventional type, adapted for insertion in a pair of main transmission lines, for example, for the horizontal and vertical polarization signals of a satellite television broadcast, respectively. The first coupler 12 includes a main transmission conductor 12a and a branch conductor 12b and has an input terminal 16, an output terminal 18 and a branch terminal 20. The other end of the branch conductor 12b is grounded through a resistor 17. Similarly, the second coupler 14 includes a main transmission conductor 14a and a branch conductor 14b and has an input terminal 22, an output terminal 24 and a branch terminal 26. The other end of the branch conductor 14b is grounded through a resistor 23.

The branch terminal 20 of the first coupler 12 is coupled through a capacitor 28 to the anode of a diode 30 the cathode of which is coupled through a capacitor 32 to a branch output terminal 34. The branch terminal 26 of the second coupler 14 is coupled through a capacitor 36 to the cathode of a diode 38 the anode of which is connected to the junction between the diode 30 and the capacitor 32, which is grounded through an inductor 72. The junction between the capacitor 28 and the diode 30 is coupled through a capacitor 40 to the cathode of a diode 42 the anode of which is grounded through a resistor 44, and the junction between the capacitor 36 and the diode 38 is coupled through a capacitor 46 to an anode of a diode 48 the cathode of which is grounded through a resistor 50. The junction between the capacitor 40 and the diode 42 is connected through series inductors 52 and 54 to a junction between the capacitor 46 and the diode 48. The junction 56 between both inductors 52 and 54 is connected through a resistor 58 and an inductor 60 to the output terminal 34. The anode of the diode 30 is connected through series inductors 62 and 64 to the cathode of the diode 38, and the junction 66 between both inductors 62 and 64 is connected through a resistor 68 to the junction 70 between the resistor 58 and the inductor 60. The numerals 74, 76, 78, 81 and 82 denote by-pass capacitors, respectively.

Assuming now the event of horizontal and vertical polarized transmission for instance, input coaxial cables for the horizontal and vertical polarization signals are connected respectively to the input terminals 16 and 22, output coaxial cables therefor are connected respectively to the output terminals 18 and 24, and a branch coaxial cable 11 to an indoor receiving unit 6 (FIG. 2) is connected to the branch output terminal 34. Outer conductors of the coaxial cables are grounded as shown.

In operation, if a positive DC voltage is applied to the branch output terminal 34 through the coaxial cable 11 connected thereto, a DC current flows therefrom through the inductor 60, resistor 68, inductor 62, diode 30 and inductor 72 to ground, and the diode 30 is rendered conductive. Therefore, the branch terminal 20 is AC coupled to the branch output terminal 34 and the horizontal polarization signal induced at the branch terminal 20 is transferred to the branch output terminal 34 and, accordingly, to the indoor receiving unit 6.

At the same time, the DC current flows also through the inductor 60, resistor 58, inductor 54, diode 48 and resistor 50 to ground, and the diode 48 is rendered conductive. Therefore, the branch terminal 26 carrying the induced vertical polarization signal is grounded through the dummy resistor 50 to avoid the problem of mismatch. The diodes 38 and 42 are left non-conductive in this case, since the positive voltage is applied to their cathodes.

On the contrary, if a negative DC voltage is applied to the branch output terminal 34 through the coaxial cable connected thereto, a DC current flows from the ground through the inductor 72, diode 38, inductor 64, resistor 68 and inductor 60 to the output terminal 34, and the diode 38 is rendered conductive. Therefore, the branch terminal 26 is AC coupled to the branch output terminal 34 and the vertical polarization signal induced at the branch terminal 26 is transferred to the branch output terminal 34 and, accordingly, to the indoor unit.

At the same time, the DC current flows also from the ground through the resistor 44, diode 42, inductor 52, resistor 58 and inductor 60 to the output terminal 34, and the diode 42 is rendered conductive. Therefore, the branch terminal 20 carrying the induced horizontal polarization signal is grounded through the dummy resistor 44 to avoid the problem of mismatch. The diodes 30 and 48 are left non-conductive in this case, since the negative voltage is applied to their anodes.

As described above, in the apparatus of this invention, two kinds of waves can be selectively supplied to the indoor unit 6 through a single coupling cable 11, as shown in FIG. 2, by merely selecting the polarity of the DC voltage applied to the branch output terminal 34 through the same cable 11 from the indoor unit 6, with no problem of mismatch.

Figure 4:
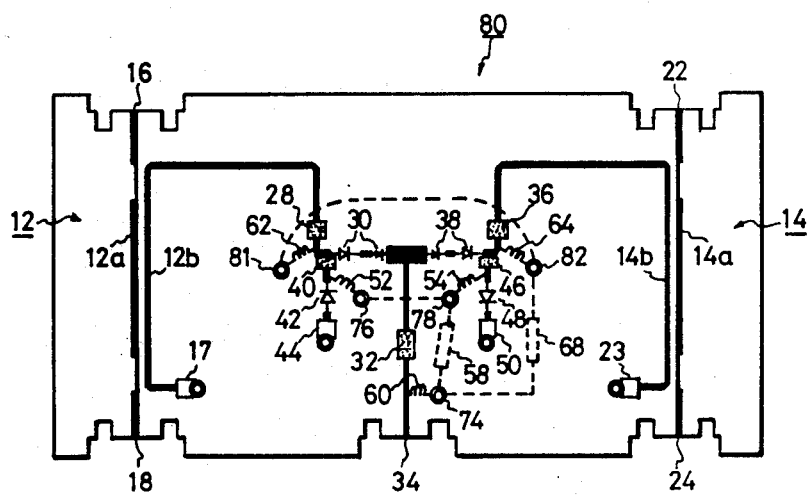
FIG. 4 is a schematic plan view representing a printed circuit board on which the circuit of FIG. 3 is embodied.

FIG. 4 shows an actual example of the inventive signal coupling apparatus in which the circuit of FIG. 3 is constructed on a printed circuit board 80. Like reference numerals are used to denote corresponding circuit components as shown in FIG. 3. While some of the components are shown symbolically for simplification and clarification, they are actually commercially available discrete electronic components soldered to microstrip lines printed on the board. As shown, the directional couplers 12 and 14 are composed of microstrip lines 12a, 12b and 14a and 14b, respectively, printed on the board 80. The main transmission lines 12a and 14a are shown to have their middle portions widened relative to their end portions except for terminal contact portions 16, 18 and 22, 24. This is for the purpose of improving input and output return loss characteristics of the couplers 12 and 14 and its detailed description has been made in copending Japanese Utility Model Application No. 58-45506 filed Mar. 28, 1983. The printed circuit board 80 has five cutouts at the terminals 16, 18, 22, 24 and 34 for engaging with coupling plugs respectively connected to corresponding input and output coaxial cables. Those components and lines shown in dashed lines are disposed on the other side of the board 80. As shown, the apparatus of this invention can be realized in compact and economical fashion.

What is claimed is:

1. Signal coupling apparatus for selectively coupling either of two signals transmitted along first and second main transmission lines, respectively, to a single branch line; comprising first and second directional couplers adapted for insertion in said first and second main transmission lines, respectively, with each being provided with a branch terminal; an output terminal adapted for connection to said branch line; a first diode coupled between said branch terminal of said first coupler and said output terminal; a second diode coupled between said branch terminal of said second coupler and said output terminal; said first and second diodes having first and second polarities, respectively, with respect to said output terminal; a first series connection of a third diode and a first dummy resistor coupled between the branch terminal of said first coupler and a reference potential point; a second series connection of a fourth diode and a second dummy resistor coupled between the branch terminal of said second coupler and said reference potential point; and said third and fourth diodes having said second and first polarities, respectively, with respect to said reference potential point.

2. Apparatus, in accordance with claim 1, further comprising means for applying a DC voltage of a selected polarity to said output terminal through said branch line.

* * * * *

UNITED STATES PATENT OFFICE
CERTIFICATE OF CORRECTION

Patent No. 4,527,136　　　　　　　　Dated July 2, 1985

Inventor(s) Kimitaka Kamiya

It is certified that error appears in the above-identified patent and that said Letters Patent are hereby corrected as shown below:

On the title page

Change the name of Assignee [73] from

"501 DX Antenna Company, Limited" to

- - DX Antenna Company, Limited - -

Signed and Sealed this

Twelfth Day of November 1985

[SEAL]

Attest:

Attesting Officer

DONALD J. QUIGG

Commissioner of Patents and Trademarks